United States Patent
Swift

(10) Patent No.: US 9,884,212 B2
(45) Date of Patent: Feb. 6, 2018

(54) ANECHOIC CHAMBER FIRE SUPPRESSION SYSTEM

(71) Applicant: Dan Swift, Newburyport, MA (US)

(72) Inventor: Dan Swift, Newburyport, MA (US)

(*) Notice: Subject to any disclaimer, the term of this patent is extended or adjusted under 35 U.S.C. 154(b) by 7 days.

(21) Appl. No.: 15/214,411

(22) Filed: Jul. 19, 2016

(65) Prior Publication Data

US 2016/0325126 A1 Nov. 10, 2016

Related U.S. Application Data

(63) Continuation-in-part of application No. 14/445,243, filed on Jul. 29, 2014, now Pat. No. 9,393,452.

(51) Int. Cl.
| | |
|---|---|
| A62C 3/00 | (2006.01) |
| A62C 35/68 | (2006.01) |
| A62C 37/36 | (2006.01) |
| G01R 29/10 | (2006.01) |
| A62C 35/60 | (2006.01) |
| A62C 37/46 | (2006.01) |

(52) U.S. Cl.
CPC .............. *A62C 3/00* (2013.01); *A62C 35/60* (2013.01); *A62C 35/68* (2013.01); *A62C 37/36* (2013.01); *A62C 37/46* (2013.01); *G01R 29/105* (2013.01)

(58) Field of Classification Search
CPC ........... A62C 35/60; A62C 37/46; A62C 3/00; A62C 35/68; A62C 37/36; G01R 29/105
See application file for complete search history.

(56) References Cited

U.S. PATENT DOCUMENTS

| | | | | |
|---|---|---|---|---|
| 4,305,469 A * | 12/1981 | Morrisette | ............. | A62C 37/00 137/625.18 |
| 5,711,485 A * | 1/1998 | Wheeler | ............... | B05B 7/1245 239/105 |
| 6,824,076 B2 * | 11/2004 | Harris | .................... | A01G 25/16 169/46 |
| 7,823,650 B2 * | 11/2010 | Eckholm | ................ | A62C 37/44 169/17 |
| 8,087,468 B2 * | 1/2012 | Eckholm | ................ | A62C 37/44 169/20 |
| 8,459,369 B2 * | 6/2013 | Eckholm | ................ | A62C 37/44 169/20 |
| 2009/0178813 A1 * | 7/2009 | Eckholm | ................ | A62C 37/44 169/20 |
| 2011/0094758 A1 * | 4/2011 | Burkhart | ................ | A62C 35/62 169/17 |

* cited by examiner

*Primary Examiner* — Arthur O Hall
*Assistant Examiner* — Steven M Cernoch
(74) *Attorney, Agent, or Firm* — Daniel N. Smith

(57) ABSTRACT

A fire suppression system for anechoic chambers with multiple non-retractable tubes fixed on the ceiling of the chamber, with each tube connected to a pneumatic valve. Each valve is controlled by a compressed air supply that reacts to the presence of fire in the chamber. Once fire is detected in the chamber, the valves vent the compressed air to permit fire retardant fluid to pass through the fixed tubes into the chamber. The tubes and the valves do not interfere with the functions of the chamber and provide immediate fire suppression.

20 Claims, 3 Drawing Sheets

ANECHOIC CHAMBER FIRE SUPPRESSION SYSTEM

CROSS REFERENCE TO RELATED APPLICATION

This application is a continuation-in-part and claims the priority to and the benefit of U.S. patent application Ser. No. 14/445,243, filed on Jul. 29, 2014, the contents of which are incorporated herein by reference.

FIELD OF THE INVENTION

The field of the invention relates to non-retractable fire suppression system for anechoic chambers that does not interfere with the functions of the chamber and provides immediate fire suppression.

BACKGROUND OF INVENTION

The radiation, sound, or noise emitted by an electronic product has been increasingly important. It may be desirable to limit such noise to avoid interference with the electronics of nearby objects or vehicles. Governments may also set stringent standards for such radiation emissions. Accordingly, a large number of consumer, industrial, and military products and industrial equipment must now undergo radiation emission testing.

Anechoic chambers are frequently employed in such radiation emissions tests. Anechoic chambers are rooms specifically designed to completely absorb sound or electromagnetic waves. The interior walls, floor, and ceilings of these chambers are lined with sound (acoustically absorbent) or electromagnetic absorbing (radiation absorbent) materials to eliminate interior reflected sound. The exteriors of these chambers are also insulated to allow predictable transmission loss characteristics from the exterior of the anechoic chamber to the interior of the anechoic chamber.

These chambers reduce sound or electromagnetic reflections and external noises to test acoustics (sound waves), antennae, radars, of the electromagnetic interference of other electronics. All sound or electromagnetic energy emitted from the object being tested will be traveling away from the test object with almost none reflected back.

Many of these anechoic chambers can be quite large, since testing can be conducted on full-scale objects, including aircraft or other vehicles.

The radiation absorbent materials of these chambers are designed and shaped to absorb radio frequency radiation from as many directions as possible. One of the most effective types of radiation absorbent structures comprises arrays of pyramid shaped pieces, or cones composed of radiation absorbent materials. Usually these cones will comprise a foam material containing mixtures of carbon and iron. The length from base to tip of the pyramid structure is chosen based on the lowest expected frequency and the amount of absorption required. For low frequency damping, this distance is often 24 inches, while high frequency panels are as short as 3-4 inches.

To work effectively, all internal surfaces (walls, ceiling, and floor) of the anechoic chamber must be completely covered with these cones. These cones are installed with the tips pointing inward to the chamber. Sections of these cones may be temporarily removed to install equipment but they must be replaced before performing any tests. Any testing equipment (as opposed to the equipment under test) to be used within the anechoic chambers must expose as few metallic surfaces as possible, as these risk causing unwanted radiation reflections.

A significant problem with anechoic chambers is that these radiation absorbent structures are very flammable. As the radiation absorbent cones absorb radiation, this absorption generates heat within the cones. If this generated heat cannot be dissipated there is a risk that hot spots may develop and the temperatures within the cones may rise to the point of combustion. Testing at high frequencies can start the cone material on fire. Once this fire begins, it will spread rapidly through the remaining flammable cones.

Unfortunately, standard fire suppression systems, such as water sprinklers, cannot be installed within anechoic chambers since these suppression systems are constructed of materials or in configurations that would interfere with the radiation absorbent structures. Some radiation absorbent structures can be treated with fire retardants to reduce the risks of combustion, but these retardants cannot completely eliminate the risks of fire.

SUMMARY OF THE INVENTION

There are additional features of the invention that will be described hereinafter and which will form the subject matter of the claims appended hereto. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

The subject invention discloses a fire suppression system for an anechoic chamber comprising: a plurality of pneumatic valves attached above and exterior to a top surface of the anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the anechoic chamber; a first supply of compressed air attached to and in fluid communication with each pneumatic valve exterior to the chamber; a second supply of compressed air attached to and in fluid communication with each pneumatic valve through an air switch exterior to the chamber; a supply of fire retardant fluid attached to and in fluid communication with each pneumatic valve exterior to the chamber; a fire sensor operatively connected to the supply of compressed air; wherein, the first supply of compressed air will maintain each pneumatic valve in a closed position preventing fluid communication between the valve inlet and the valve outlet, wherein the second supply of compressed air will monitor an internal air pressure of each pneumatic valve through the air switch, further wherein once the fire sensor detects a fire within the anechoic chamber, a signal is transmitted to the supply of compressed air to vent the compressed air out of a venting line that is exterior to the chamber thereby opening all the pneumatic valves and allowing fire retardant fluid to pass through into each valve into each tubing and into the anechoic chamber.

In embodiments of the subject invention, the second supply of compressed air will increase compressed air to each pneumatic valve if the air switch detects decreased internal air pressure and no signal from the fire sensor has been transmitted.

In embodiments of the subject invention, the air switch is operatively attached to an alarm that activates upon detection of decreased internal air pressure in at least one pneumatic valve.

The subject invention also discloses a fire suppression system for an anechoic chamber comprising: a plurality of pneumatic valves attached above and exterior to a top surface of the anechoic chamber, wherein each pneumatic valve comprises at least one inlet and at least one outlet, wherein each outlet only opens upon exposure to heat above 150 degrees Fahrenheit; a plurality of non-retractable tubings, wherein a first end of each tubing is in fluid communication with one of the pneumatic valves, wherein a second end of each tubing extends into the anechoic chamber; a supply of compressed air attached to and in fluid communication with each pneumatic valve exterior to the chamber; a supply of fire retardant fluid attached to and in fluid communication with each pneumatic valve exterior to the chamber; a manually activated fire alarm operatively connected to the supply of compressed air; wherein, the supply of compressed air will maintain each pneumatic valve in a closed position preventing fluid communication between the valve inlet and the valve outlet, further wherein once the fire alarm is manually activated, a signal is transmitted to the supply of compressed air to vent the compressed air out of a venting line that is exterior to the chamber thereby opening all the pneumatic valves, allowing fire retardant fluid to pass through into each valve into each tubing; and wherein once each outlet open upon exposure to heat above 150 degrees Fahrenheit in the anechoic chamber, the fire retardant fluid is released from each tubing into the anechoic chamber.

The subject invention discloses a fire suppression system for an anechoic chamber comprising: a plurality of pneumatic valves attached above and exterior to a top surface of the anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve inlet and the valve outlet, further wherein once the fire sensor detects a fire within the anechoic chamber, a signal is transmitted to the supply of compressed air to vent the compressed air out of a venting line that is exterior to the chamber, thereby opening all the pneumatic valves and allowing fire retardant fluid to pass through into each valve into each tubing and into the anechoic chamber.

Another embodiment of the subject invention is a fire suppression system for an anechoic chamber comprising: a plurality of pneumatic valves attached above and exterior to a top surface of the anechoic chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the anechoic chamber, a signal is transmitted to the supply of compressed air to vent the compressed air out of a venting line that is exterior to the chamber, thereby opening all the pneumatic valves and permitting fire retardant fluid to flow into each valve into each tubing to be discharged into the anechoic chamber.

A further embodiment of the subject invention is a fire suppression system for an anechoic chamber comprising: a plurality of pneumatic valves attached above and exterior to a top surface of the anechoic chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the anechoic chamber, a signal is transmitted to the supply of compressed air to vent the compressed air out of a venting line that is exterior to the, thereby opening all the pneumatic valves and permitting fire retardant fluid to flow into each valve into each tubing to be discharged into the anechoic chamber.

A further embodiment of the subject invention is a fire sprinkler system for an anechoic chamber comprising: a plurality of pneumatic valves attached above and exterior to a ceiling of the anechoic chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the anechoic chamber, a signal is transmitted to the supply of compressed air to vent the compressed air out of a venting line that is exterior to the chamber thereby opening all the pneumatic valves and allowing fire retardant fluid to pass through into each valve into each fluid conduit and into the anechoic chamber.

The subject invention additionally discloses a fire sprinkler system for an anechoic chamber comprising: a plurality of pneumatic valves attached above and exterior to a ceiling of the anechoic chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the anechoic chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the anechoic chamber.

The subject invention also discloses a fire sprinkler system for an anechoic chamber comprising: a plurality of pneumatic valves attached above and exterior to a ceiling of the anechoic chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the anechoic chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the anechoic chamber.

The subject invention further discloses a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve inlet and the valve outlet, further wherein once the fire sensor detects a fire within the semi-anechoic chamber, a signal is transmitted to the supply of compressed air to vent the compressed air out of a venting line that is exterior to the chamber thereby opening all the pneumatic valves and allowing fire retardant fluid to pass through into each valve into each tubing and into the semi-anechoic chamber.

Another embodiment of the subject invention is a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the semi-anechoic chamber.

A further embodiment of the subject invention is a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and allowing fire retardant fluid to pass through into each valve into each pipe and into the semi-anechoic chamber.

The subject invention further discloses a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the semi-anechoic chamber.

The subject invention also discloses a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and allowing fire retardant fluid to pass through into each valve into each fluid conduit and into the semi-anechoic chamber.

A further embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the semi-anechoic chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the semi-anechoic chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the semi-anechoic chamber.

The subject invention also discloses a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each tubing and into the chamber.

The subject invention further discloses a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

Another embodiment of the subject invention is a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

The subject invention also discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each pipe and into the chamber.

The subject invention further discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

Another embodiment of the subject invention is a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each fluid conduit and into the chamber.

The subject invention also discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

The subject invention further discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

Another embodiment of the subject invention is a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each tubing and into the chamber.

A further embodiment of the subject invention is a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

The subject invention additionally discloses a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

The subject invention also discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each pipe and into the chamber.

The subject invention further discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

Another embodiment of the subject invention is a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each fluid conduit and into the chamber.

The subject invention also discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

The subject invention further discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

A further embodiment of the subject invention is a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each tubing and into the chamber.

Another embodiment of the subject invention is a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

The subject invention also discloses a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve inlet and the valve outlet, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each tubing to be discharged into the chamber.

The subject invention further discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each pipe and into the chamber.

Another embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each pipe to be discharged into the chamber.

The subject invention also discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid communication between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and allowing fire retardant fluid to pass through into each valve into each fluid conduit and into the chamber.

The subject invention further discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

Another embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of compressed air attached to and in fluid communication with each pneumatic valve exterior to the chamber; a supply of fire retardant fluid attached to and in fluid communication with each pneumatic valve exterior to the chamber; a fire sensor operatively connected to the supply of compressed air; wherein, the supply of compressed air will maintain each pneumatic valve in a closed position preventing fluid flow between the valve ingress and the valve egress, further wherein once the fire sensor detects a fire within the chamber, a signal is transmitted to the supply of compressed air to vent the compressed air out of a venting line that is exterior to the chamber thereby opening all the pneumatic valves and permitting fire retardant fluid to flow into each valve into each fluid conduit to be discharged into the chamber.

The subject invention further discloses a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the anechoic chamber such that the tubing inlet and the internal channel are in fluid communication with the valve outlet of the pneumatic valve, wherein each tubing extends into the anechoic chamber through the ceiling such that the distal end and the outlet are located in the anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the tubing through the tubing inlet into the anechoic chamber through the tubing outlet.

The subject invention also discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the semi-anechoic chamber such that the tubing inlet and the internal channel are in fluid communication with the valve outlet of the pneumatic valve, wherein each tubing extends into the semi-anechoic chamber through the ceiling such that the distal end and the outlet are located in the semi-anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the tubing through the tubing inlet into the semi-anechoic chamber through the tubing outlet.

The subject invention even further discloses a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

The subject invention additionally discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

Another embodiment of the subject invention is a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

The subject invention also discloses a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the anechoic chamber such that the pipe inlet and the internal channel are in fluid communication with the valve outlet of the pneumatic valve, wherein each pipe extends into the anechoic chamber through the ceiling such that the distal end and the outlet are located in the anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the pipe through the pipe inlet into the anechoic chamber through the pipe outlet.

The subject invention further discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the semi-anechoic chamber such that the pipe inlet and the internal channel are in fluid communication with the valve outlet of the pneumatic valve, wherein each pipe extends into the semi-anechoic chamber through the ceiling such that the distal end and the outlet are located in the semi-anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the pipe through the pipe inlet into the semi-anechoic chamber through the pipe outlet.

Another embodiment of the subject invention is a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

The subject invention also discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

The subject invention further discloses a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

Another embodiment of the subject invention is a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the anechoic chamber such that the fluid conduit inlet and the internal channel are in fluid communication with the valve outlet of the pneumatic valve, wherein each fluid conduit extends into the anechoic chamber through the ceiling such that the distal end and the outlet are located in the anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the anechoic chamber through the fluid conduit outlet.

The subject invention further discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the semi-anechoic chamber such that the fluid conduit inlet and the internal channel are in fluid communication with the valve outlet of the pneumatic valve, wherein each fluid conduit extends into the semi-anechoic chamber through the ceiling such that the distal end and the outlet are located in the semi-anechoic chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the semi-anechoic chamber through the fluid conduit outlet.

The subject invention also discloses a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

The subject invention even further discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

The subject invention also discloses a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of compressed air, wherein the supply of compressed air is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of compressed air will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to vent the compressed air out of a venting line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

The subject invention discloses a fire suppression system for an anechoic chamber comprising: a plurality of pneumatic valves attached above and exterior to a top surface of the anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve inlet and the valve outlet, further wherein once the fire sensor detects a fire within the anechoic chamber, a signal is transmitted to the supply of viscous liquid to release the viscous liquid out of a release line that is exterior to the chamber, thereby opening all the pneumatic valves and allowing fire retardant fluid to pass through into each valve into each tubing and into the anechoic chamber.

Another embodiment of the subject invention is a fire suppression system for an anechoic chamber comprising: a plurality of pneumatic valves attached above and exterior to a top surface of the anechoic chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the anechoic chamber, a signal is transmitted to the supply of viscous liquid to release the viscous liquid out of a release line that is exterior to the chamber, thereby opening all the pneumatic valves and permitting fire retardant fluid to flow into each valve into each tubing to be discharged into the anechoic chamber.

A further embodiment of the subject invention is a fire suppression system for an anechoic chamber comprising: a plurality of pneumatic valves attached above and exterior to a top surface of the anechoic chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the anechoic chamber, a signal is transmitted to the supply of viscous liquid to release the viscous liquid out of a release line that is exterior to the, thereby opening all the pneumatic valves and permitting fire retardant fluid to flow into each valve into each tubing to be discharged into the anechoic chamber.

A further embodiment of the subject invention is a fire sprinkler system for an anechoic chamber comprising: a plurality of pneumatic valves attached above and exterior to a ceiling of the anechoic chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the anechoic chamber, a signal is transmitted to the supply of viscous liquid to release the viscous liquid out of a release line that is exterior to the chamber thereby opening all the pneumatic valves and allowing fire retardant fluid to pass through into each valve into each fluid conduit and into the anechoic chamber.

The subject invention additionally discloses a fire sprinkler system for an anechoic chamber comprising: a plurality of pneumatic valves attached above and exterior to a ceiling of the anechoic chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the anechoic chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the anechoic chamber.

The subject invention also discloses a fire sprinkler system for an anechoic chamber comprising: a plurality of pneumatic valves attached above and exterior to a ceiling of the anechoic chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the anechoic chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the anechoic chamber.

The subject invention further discloses a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve inlet and the valve outlet, further wherein once the fire sensor detects a fire within the semi-anechoic chamber, a signal is transmitted to the supply of viscous liquid to release the viscous liquid out of a release line that is exterior to the chamber thereby opening all the pneumatic valves and allowing fire retardant fluid to pass through into each valve into each tubing and into the semi-anechoic chamber.

Another embodiment of the subject invention is a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the semi-anechoic chamber.

A further embodiment of the subject invention is a fire suppression system for an semi-anechoic chamber comprising: a plurality of pneumatic valves attached above and exterior to a top surface of the semi-anechoic chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and allowing fire retardant fluid to pass through into each valve into each pipe and into the semi-anechoic chamber.

The subject invention further discloses a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the semi-anechoic chamber.

The subject invention also discloses a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and allowing fire retardant fluid to pass through into each valve into each fluid conduit and into the semi-anechoic chamber.

A further embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the semi-anechoic chamber.

Another embodiment of the subject invention is a fire sprinkler system for an semi-anechoic chamber comprising: a plurality of pneumatic valves attached above and exterior to a ceiling of the semi-anechoic chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the semi-anechoic chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the semi-anechoic chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the semi-anechoic chamber.

The subject invention also discloses a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each tubing and into the chamber.

The subject invention further discloses a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

Another embodiment of the subject invention is a fire suppression system for a chamber comprising internal surfaces that substantially absorb signals, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

The subject invention also discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each pipe and into the chamber.

The subject invention further discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

Another embodiment of the subject invention is a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each fluid conduit and into the chamber.

The subject invention also discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

The subject invention further discloses a fire sprinkler system for a chamber comprising internal surfaces that substantially absorb signals, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

Another embodiment of the subject invention is a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each tubing and into the chamber.

A further embodiment of the subject invention is a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

The subject invention additionally discloses a fire suppression system for a chamber comprising substantially non-echoing internal surfaces, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

The subject invention also discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each pipe and into the chamber.

The subject invention further discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

Another embodiment of the subject invention is a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each fluid conduit and into the chamber.

The subject invention also discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

The subject invention further discloses a fire sprinkler system for a chamber comprising substantially non-echoing internal surfaces, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

A further embodiment of the subject invention is a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each tubing and into the chamber.

Another embodiment of the subject invention is a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of non-telescoping tubings, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

The subject invention also discloses a fire suppression system for a chamber comprising internal surfaces that are substantially covered with radiation or acoustic absorbent materials, the system comprising: a plurality of pneumatic valves attached above and exterior to a top surface of the chamber, wherein each pneumatic valve comprises at least one inlet and at least one outlet; a plurality of tubings substantially affixed at their respective positions, wherein a first end of each tubing is in fluid communication with one of the pneumatic valves, wherein a second end of each tubing extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve inlet and the valve outlet, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each tubing to be discharged into the chamber.

The subject invention further discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-retractable pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each pipe and into the chamber.

Another embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-telescoping pipes, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

A further embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of pipes substantially affixed at their respective positions, wherein a first end of each pipe is in fluid communication with one of the pneumatic valves, wherein a second end of each pipe extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each pipe to be discharged into the chamber.

The subject invention also discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-retractable fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid communication between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and allowing fire retardant fluid to pass through into each valve into each fluid conduit and into the chamber.

The subject invention further discloses a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of non-telescoping fluid conduits, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

Another embodiment of the subject invention is a fire sprinkler system for a chamber comprising internal surfaces that are substantially covered with radiation or acoustic absorbent materials, the system comprising: a plurality of pneumatic valves attached above and exterior to a ceiling of the chamber, wherein each pneumatic valve comprises at least one ingress and at least one egress; a plurality of fluid conduits substantially affixed at their respective positions, wherein a first end of each fluid conduit is in fluid communication with one of the pneumatic valves, wherein a second end of each fluid conduit extends into the chamber; a supply of viscous liquid attached to and in fluid communication with each pneumatic valve exterior to the chamber; a supply of fire retardant fluid attached to and in fluid communication with each pneumatic valve exterior to the chamber; a fire sensor operatively connected to the supply of viscous liquid; wherein, the supply of viscous liquid will maintain each pneumatic valve in a closed position preventing fluid flow between the valve ingress and the valve egress, further wherein once the fire sensor detects a fire within the chamber, a signal is transmitted to the supply of viscous liquid to release the viscous liquid out of a release line that is exterior to the chamber thereby opening all the pneumatic valves and permitting fire retardant fluid to flow into each valve into each fluid conduit to be discharged into the chamber.

The subject invention further discloses a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the anechoic chamber such that the tubing inlet and the internal channel are in fluid communication with the valve outlet of the pneumatic valve, wherein each tubing extends into the anechoic chamber through the ceiling such that the distal end and the outlet are located in the anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the tubing through the tubing inlet into the anechoic chamber through the tubing outlet.

The subject invention also discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the semi-anechoic chamber such that the tubing inlet and the internal channel are in fluid communication with the valve outlet of the pneumatic valve, wherein each tubing extends into the semi-anechoic chamber through the ceiling such that the distal end and the outlet are located in the semi-anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the tubing through the tubing inlet into the semi-anechoic chamber through the tubing outlet.

The subject invention even further discloses a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

The subject invention additionally discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

Another embodiment of the subject invention is a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of tubings comprising an internal channel from a tubing inlet on a proximal end to tubing outlet on a distal end, wherein the proximal end of each tubing is attached to one of the pneumatic valves above and exterior to the ceiling of the chamber such that the tubing inlet and the internal channel are in fluid communication with the valve outlet of the pneumatic valve, wherein each tubing extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the tubing through the tubing inlet into the chamber through the tubing outlet.

The subject invention also discloses a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the anechoic chamber such that the pipe inlet and the internal channel are in fluid communication with the valve outlet of the pneumatic valve, wherein each pipe extends into the anechoic chamber through the ceiling such that the distal end and the outlet are located in the anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the pipe through the pipe inlet into the anechoic chamber through the pipe outlet.

The subject invention further discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the semi-anechoic chamber such that the pipe inlet and the internal channel are in fluid communication with the valve outlet of the pneumatic valve, wherein each pipe extends into the semi-anechoic chamber through the ceiling such that the distal end and the outlet are located in the semi-anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the pipe through the pipe inlet into the semi-anechoic chamber through the pipe outlet.

Another embodiment of the subject invention is a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

The subject invention also discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

The subject invention further discloses a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of pipes comprising an internal channel from a pipe inlet on a proximal end to pipe outlet on a distal end, wherein the proximal end of each pipe is attached to one of the pneumatic valves above and exterior to the ceiling of the chamber such that the pipe inlet and the internal channel are in fluid communication with the valve outlet of the pneumatic valve, wherein each pipe extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the pipe through the pipe inlet into the chamber through the pipe outlet.

Another embodiment of the subject invention is a fire sprinkler system for an anechoic chamber comprising: a plurality of pneumatic valves attached above and exterior to a ceiling of the anechoic chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the anechoic chamber such that the fluid conduit inlet and the internal channel are in fluid communication with the valve outlet of the pneumatic valve, wherein each fluid conduit extends into the anechoic chamber through the ceiling such that the distal end and the outlet are located in the anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the anechoic chamber through the fluid conduit outlet.

The subject invention further discloses a fire sprinkler system for a semi-anechoic chamber comprising: a plurality of pneumatic valves attached above and exterior to a ceiling of the semi-anechoic chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the semi-anechoic chamber such that the fluid conduit inlet and the internal channel are in fluid communication with the valve outlet of the pneumatic valve, wherein each fluid conduit extends into the semi-anechoic chamber through the ceiling such that the distal end and the outlet are located in the semi-anechoic chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the semi-anechoic chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the semi-anechoic chamber through the fluid conduit outlet.

The subject invention also discloses a fire sprinkler system for a chamber comprising internal surfaces that substantially absorb signals, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

The subject invention even further discloses a fire sprinkler system for a chamber comprising substantially non-echoing internal surfaces, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

The subject invention also discloses a fire sprinkler system for a chamber comprising internal surfaces that are substantially covered with radiation or acoustic absorbent materials, wherein the system comprises: a plurality of pneumatic valves attached above and exterior to a ceiling of the chamber, wherein each pneumatic valve comprises a valve inlet and a valve outlet; a plurality of fluid conduits comprising an internal channel from a fluid conduit inlet on a proximal end to fluid conduit outlet on a distal end, wherein the proximal end of each fluid conduit is attached to one of the pneumatic valves above and exterior to the ceiling of the chamber such that the fluid conduit inlet and the internal channel are in fluid communication with the valve outlet of the pneumatic valve, wherein each fluid conduit extends into the chamber through the ceiling such that the distal end and the outlet are located in the chamber; a supply of viscous liquid, wherein the supply of viscous liquid is attached to and in fluid communication with an electric actuator through a restricted orifice or opening on the plurality of pneumatic valves; a wet sprinkler system containing a supply of fire retardant fluid, wherein the wet sprinkler system is attached to and in fluid communication with each pneumatic valve exterior to the chamber; a fire sensor operatively connected to the electric actuator; wherein, the supply of viscous liquid will pass through the restricted orifice or opening to maintain each pneumatic valve in a closed position preventing fluid communication between the valve inlet and the valve outlet, further wherein once the fire sensor detects a fire within the chamber, a signal is transmitted to the electric actuator to release the viscous liquid out of a release line that is exterior to the chamber thereby opening all the pneumatic valves and allowing fluid communication between the valve inlet and the valve outlet to allow fire retardant fluid to pass through the valve inlet, and into the fluid conduit through the fluid conduit inlet into the chamber through the fluid conduit outlet.

In embodiments of the subject invention, the plurality of tubings, pipes, and fluid conduits may be substantially non-retracting. In other embodiments of the subject invention, the plurality of tubings, pipes, and fluid conduits may be substantially non-telescoping. In embodiments of the subject invention, the plurality of tubings, pipes, and fluid conduits may be substantially non-extending. In additional embodiments of the subject invention, the plurality of tubings, pipes, and fluid conduits may be substantially affixed at their positions.

In embodiments of the subject invention, the second ends of the plurality of tubings, pipes, and fluid conduits may comprise a plurality of open or closed sprinkler heads.

In further embodiments of the subject invention, the plurality of sprinkler heads may each comprise an open sprinkler head that allows fire retardant fluid into the whole chamber.

In additional embodiments of the subject invention, the plurality of sprinkler heads may each comprise a closed sprinkler head, wherein each closed sprinkler head only opens upon detection of heat to allow fire retardant fluid into the chamber.

In embodiments of the subject invention, the plurality of tubings, pipes, and fluid conduits may not substantially reflect radiation or sound energy. In further embodiments of the subject invention, the plurality of tubings, pipes, and fluid conduits may not substantially echo radiation or sound energy. In other embodiments of the subject invention, the plurality of tubings, pipes, and fluid conduits may substantially absorb radiation or sound energy. In further embodiments of the subject invention, the plurality of tubings, pipes, and fluid conduits may be substantially covered with anechoic materials, radiation absorbent materials or acoustically absorbent materials.

In embodiments of the subject invention, the plurality of sprinkler heads or pneumatic valves may not substantially interfere with the anechoic chamber. In further embodiments of the subject invention, the plurality of sprinkler heads or pneumatic valves may not substantially reflect radiation or sound energy. In other embodiments of the subject invention, the plurality of sprinkler heads or pneumatic valves may not substantially echo radiation or sound energy. In further embodiments of the subject invention, the plurality of sprinkler heads or pneumatic valves may substantially absorb radiation or sound energy. In additional embodiments of the subject invention, the sprinkler heads or plurality of pneumatic valves may be substantially covered with anechoic materials, radiation absorbent materials or acoustically absorbent materials.

In further embodiments of the subject invention, the anechoic chambers may be a radio frequency (RF) anechoic chamber or an acoustic anechoic chamber.

In other embodiments of the subject invention, the internal surfaces of the anechoic chambers may be substantially covered with anechoic materials, radiation absorbent material or acoustically absorbent material.

In embodiments of the subject invention, the signals may be sound energy signals, electromagnetic energy signals, radiation energy signals, or any combination of these signals.

In embodiments of the subject invention, the supply of compressed air may be located exterior to the chamber.

In additional embodiments of the subject invention, the wet sprinkler system may be located exterior to the chamber.

In embodiments of the subject invention, each tubing, pipe, or fluid conduit outlet may be located above a predetermined area of the chamber to be protected from fire.

In further embodiments of the subject invention, the location where each tubing, pipe, or fluid conduits extends into the anechoic chamber through the ceiling comprises an anechoic gasket and at least two flanges.

In other embodiments of the subject invention, each tubing, pipe, or fluid conduit may comprise phenolic tubing.

In embodiments of the subject invention, the fire sensor may be selected from the group consisting of a smoke detector, a heat detector, a light detector, and a fire detector.

In further embodiments of the subject invention, the fire retardant fluid may be selected from the group consisting of natural water and water mixed with fire fighting additives.

In other embodiments of the subject invention, the fire suppression system may be activated manually.

In embodiments of the subject invention, the term "substantially" is defined as at least close to (and can include) a given value or state, as understood by a person of ordinary skill in the art. In one embodiment, the term "substantially" refers to ranges within 10%, preferably within 5%, more preferably within 1%, and most preferably within 0.1% of the given value or state being specified.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto. These together with other objects of the invention, along with the various features of novelty, which characterize the invention, are pointed out with particularity in the claims annexed to and forming a part of this disclosure.

BRIEF DESCRIPTION OF THE DRAWINGS

Advantages of the present invention will be apparent from the following detailed description of exemplary embodiments thereof; which description should be considered in conjunction with the accompanying drawings.

DETAILED DESCRIPTION OF EMBODIMENTS

The following will describe, in detail, several embodiments of the present invention. These embodiments are provided by way of explanation only, and thus, should not unduly restrict the scope of the invention. In fact, those of ordinary skill in the art will appreciate upon reading the present specification and viewing the present drawings that the invention teaches many variations and modifications, and that numerous variations of the invention may be employed, used and made without departing from the scope and spirit of the invention.

Figure 1:
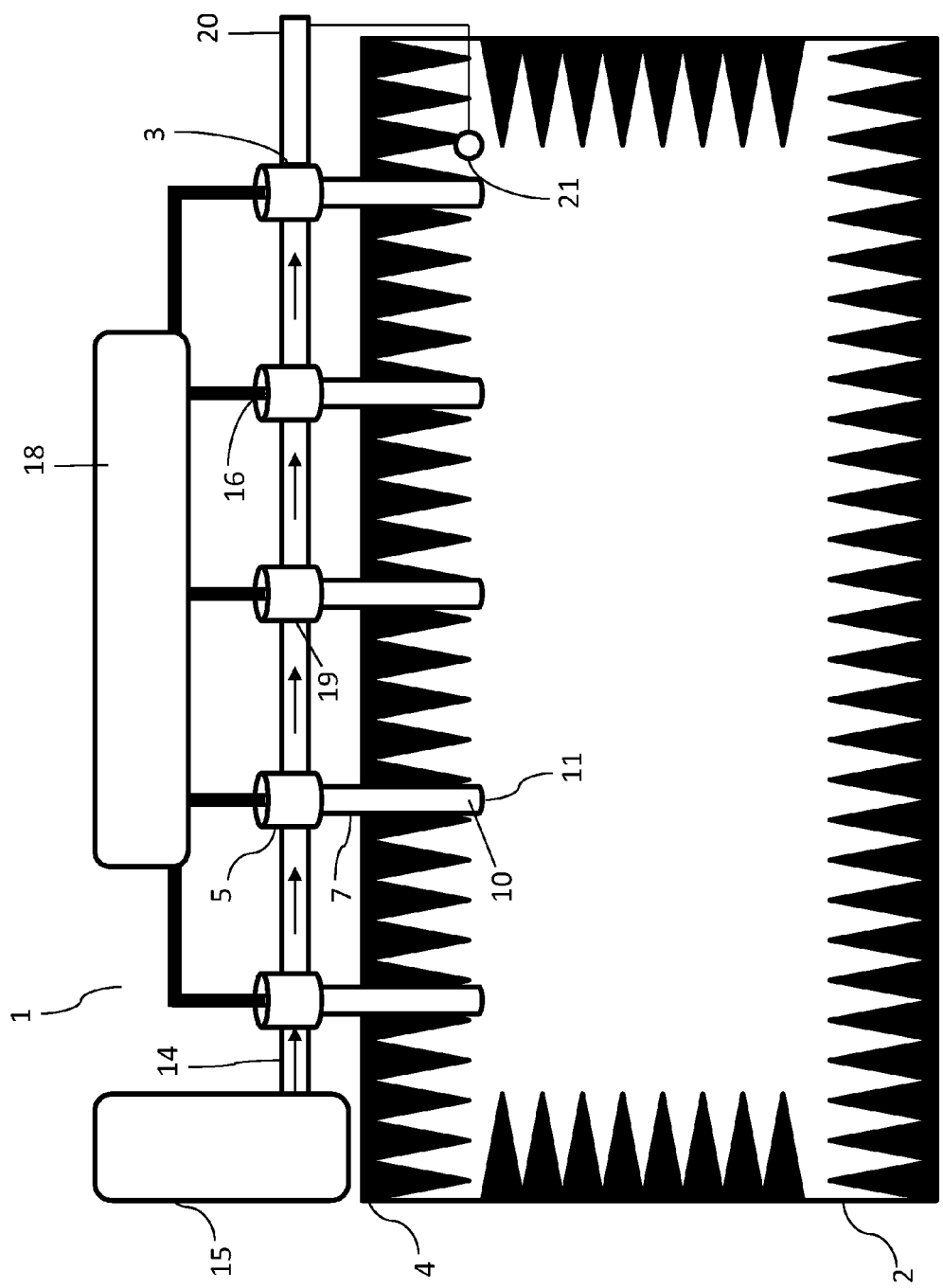
FIG. 1 is a front view of one embodiment of a fire suppression system in standby mode over an anechoic chamber.
Figure 2:
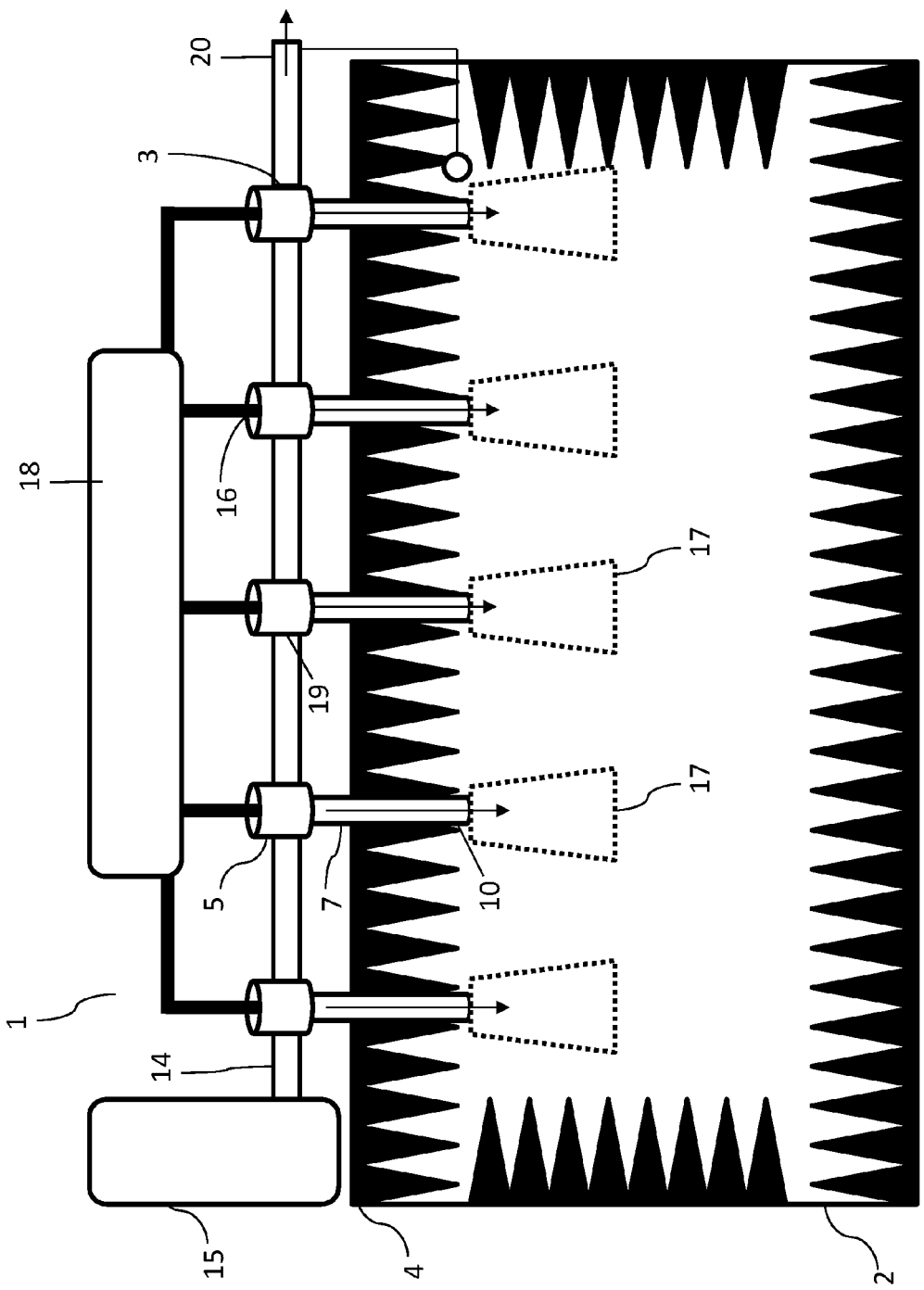
FIG. 2 is a front view of one embodiment of the fire suppression system in the active mode over the anechoic chamber.
Figure 3:
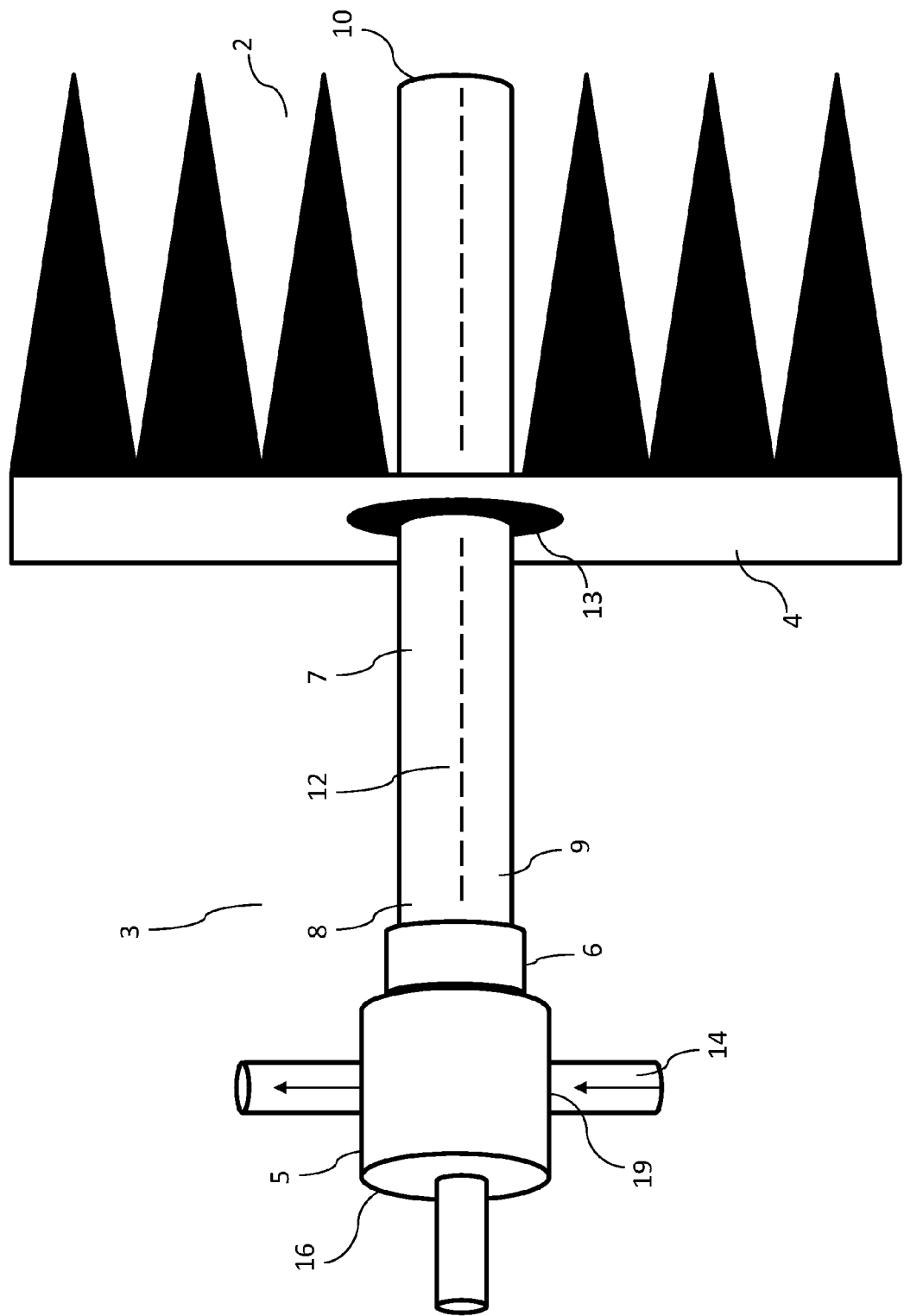
FIG. 3 is a front view of one embodiment of a fire suppression unit of the subject system.

As illustrated in FIGS. 1-3, the subject invention comprises a non-retracting, substantially non-reflective fire suppression system 1 for use with an anechoic chamber 2.

The system 1 comprises a plurality of fire suppression units 3 attached to the ceiling 4 of an anechoic chamber 2. Each fire suppression unit 3 comprises a pneumatic valve 5 with an outlet 6 attached to and in fluid communication with an inlet 8 of a tubing extension 7. Each pneumatic valve 5 will be located above and outside the anechoic chamber 2 to minimize any noise interference in the chamber 2 from the pneumatic valve 5. The tubing extension inlet 8 will attached to and in fluid communication with the pneumatic valve outlet 6 at a proximal end 9 of the tubing above and outside the anechoic chamber 2. The tubing 7 extends into the anechoic chamber 2 to a distal end 10 located in the chamber 2. This distal end 10 of the tubing 7 comprises an outlet 11 for fire retardant fluid 17 to emerge into the anechoic chamber 2 upon activation of the fire suppression system 1. Each outlet 11 will be located above a predetermined area of the anechoic chamber 2 to be protected from fire. The tubing 7 will comprise an internal channel 12 from the tubing inlet 8 to the tubing outlet 11.

The tubing 7 will comprise an anechoic gasket and at least two flanges (or another mechanical seal) at its entry point 13 into the anechoic chamber 2 to minimize any noise interference in the chamber 2. Each tubing 7 may be comprised of phenolic tubing that will not reflect any radiation during testing to minimize any noise interference in the chamber. Phenolic tubing is the same material found in Phenolic Sheet or Rod but has been wound into tube form and cured in an oven to become rigid. Phenolic tubing is lightweight, hard, dense, provides stability, easy to manufacture, and can withstand high temperatures from fires.

In the system standby mode, each pneumatic valve 5 is maintained in a closed position by constant air pressure 14 supplied by supply of compressed air 15. This supply of compressed air 15 may be located proximate to the valves 5, but it will not be contained within the anechoic chamber 2 or anywhere proximate enough to the anechoic chamber 2 so as to cause noise interference within the chamber. These compressed air suppliers are well-known to those skilled in the art. In embodiments of the subject invention, this supply of compressed air 15 may be obtained from compressing atmospheric air, thereby providing a sustainable supply of air.

Each pneumatic valve 5 will contain an inlet 16 in fluid communication with a fire retardant fluid 17 supplied from a wet sprinkler system 18. Each wet sprinkler would be live to each pneumatic valve 5 through the inlet 16. This wet sprinkler system 18 may be located proximate to the valves 5, but it will not be contained within the anechoic chamber 2 or anywhere proximate enough to the anechoic chamber 2 so as to cause noise interference within the chamber. These wet sprinkler systems are well-known to those skilled in the art.

The compressed air 14 will pass from the supply of compressed air 15 through a restricted orifice or opening 19 where it will be vented by way of an electric actuator 20 that is operatively connected to a fire detection system 21. In embodiments of the subject invention, the fire detection system 21 may be tripped through a heat, fire, or smoke detection. This fire detection system 21 may be located proximate to the valves 5, but it will not be contained within the anechoic chamber 2 or anywhere proximate enough to the anechoic chamber 2 so as to cause noise interference within the chamber. These fire detection systems are well-known to those skilled in the art.

As illustrated in FIG. 2, once the fire detection system 21 detects smoke, heat, or fire, this system 21 will open the electric actuator 20 and allow the compressed air 14 to vent out thereby opening all the pneumatic valves 5 (each valve, aka sprinkler head does not open individually it is all or nothing). The open pneumatic valves 5 would receive the fire retardant fluid 17 supplied through the inlet 16 in fluid communication with the wet sprinkler system 18. This fire retardant fluid 17 will then proceed into and through each tubing extension 7, and through the distal end outlets 11 of the tubings 7 into the anechoic chamber 2 from the ceiling 4. The fire retardant fluid 17 would be distributed over the predetermined area of the anechoic chamber 2 to be protected from fire. This would complete the activation of the fire suppression system 1.

In embodiments of the subject invention, it is crucial that the compressed air 14 from the supply of compressed air 15 passes through the restricted orifice or opening 19 to make sure that this compressed air supply will not be able to keep up with the air coming in thereby exhaust the air supply. If this compressed air supply 15 is exhausted prematurely, the lack of compressed air 14 will allow all the pneumatic valves 5 to open. The system would be activated, thereby releasing fire retardant fluid 17 into the anechoic chamber 2.

In embodiments of the subject invention, the outlets 11 may each comprise an open or closed sprinkler head. A closed sprinkler head only opens upon detection of heat above 150 degrees Fahrenheit in the chamber 2 to allow fire retardant fluid 17 into the chamber 2. If the system 1 is manually activated by a fire alarm operatively connected to the system 1, or if the compressed air 14 is accidentally discharged through the restricted orifice or opening 19 and all the valves 5 open, the closed sprinkler heads prevent the chamber 2 from being flooded with fire retardant fluid 17 until each closed sprinkler head detects high ambient temperatures above 150 degrees Fahrenheit in the chamber 2. Only the area within the chamber 2 with high ambient heat will receive fire retardant fluid 17 from closed sprinkler heads that open with heat activation.

In another embodiment of the subject invention, the system 1 includes a separate supervisory air line to monitor the internal air pressure of each pneumatic valve 5. This supervisory air line would be connected to each pneumatic valve 5 through a restricted orifice or opening with an air switch, such as a PS40 air switch. This air switch would register increases or decreases in internal air pressure in each pneumatic valve 5. This air switch could be operatively connected, or wired, to an alarm system. In the event the internal air pressure in a pneumatic valve 5 decreased due to accident or mechanical failure, the air switch would actively the alarm and shut down the system 1 to prevent fire retardant fluid from entering the chamber 2 prematurely. In one embodiment of the subject invention, the air switch could add air pressure to each pneumatic valve 5 with decreased internal air pressure to prevent the them from opening and releasing fire retardant fluid into the chamber 2

In embodiments of the subject invention, the fire retardant fluid 17 may comprise natural water or appropriate mixtures of natural water and one or more additives to enhance fire-fighting properties of a fire protection system.

In a further embodiment of the subject invention, each fire suppression system 1 may contain multiple sets of pneumatic valves 5 separately connected to separate compressed air supplies 15, wet sprinkler systems 18, and fire detection systems 21. In this embodiment, these fire suppression systems 1 may be operated separately from one another to activate independently to provide fire retardant fluid 17 to separate areas of the anechoic chamber 2.

In other embodiments of the subject invention, the fire suppression system 1 of the subject invention may be activated manually.

The many aspects and benefits of the invention are apparent from the detailed description, and thus, it is intended for the following claims to cover such aspects and benefits of the invention, which fall within the scope, and spirit of the invention.

What is claimed is:

1. A fire suppression system for an anechoic chamber comprising: a plurality of pneumatic valves attached above and exterior to a top surface of the anechoic chamber, wherein each pneumatic valve comprises at least one inlet and at least one outlet; a plurality of non-retractable tubings, wherein a first end of each tubing is in fluid communication with one of the pneumatic valves, wherein a second end of each tubing extends into the anechoic chamber; a first supply of compressed air attached to and in fluid communication with each pneumatic valve exterior to the chamber; a second supply of compressed air attached to and in fluid communication with each pneumatic valve through an air switch exterior to the chamber; a supply of fire retardant fluid attached to and in fluid communication with each pneumatic valve exterior to the chamber; a fire sensor operatively connected to the supply of compressed air; wherein, the first supply of compressed air will maintain each pneumatic valve in a closed position preventing fluid communication between the valve inlet and the valve outlet, wherein the second supply of compressed air will monitor an internal air pressure of each pneumatic valve through the air switch, further wherein once the fire sensor detects a fire within the anechoic chamber, a signal is transmitted to the supply of compressed air to vent the compressed air out of a venting line that is exterior to the chamber thereby opening all the pneumatic valves and allowing fire retardant fluid to pass through into each valve into each tubing and into the anechoic chamber.

2. The fire suppression system of claim 1, wherein the second supply of compressed air will increase compressed air to each pneumatic valve if the air switch detects decreased internal air pressure and no signal from the fire sensor has been transmitted.

3. The fire suppression system of claim 1, wherein the air switch is operatively attached to an alarm that activates upon detection of decreased internal air pressure in at least one pneumatic valve.

4. The fire suppression system of claim 1, wherein the plurality of tubings do not substantially reflect radiation.

5. The fire suppression system of claim 1, wherein the plurality of tubings substantially absorb radiation.

6. The fire suppression system of claim 1, wherein the plurality of tubings are substantially covered with radiation absorbent material.

7. The fire suppression system of claim 1, wherein the plurality of pneumatic valves do not substantially reflect radiation.

8. The fire suppression system of claim 1, wherein the plurality of pneumatic valves substantially absorb radiation.

9. The fire suppression system of claim 1, wherein the plurality of pneumatic valves are substantially covered with radiation absorbent material.

10. The fire suppression system of claim 1, wherein the anechoic chamber may be selected from the group consisting of a semi-anechoic chamber, a radio frequency (RF) anechoic chamber, and an acoustic anechoic chamber.

11. The fire suppression system of claim 1, wherein the first and second supplies of compressed air are located exterior to the anechoic chamber.

12. The fire suppression system of claim 1, wherein the wet sprinkler system is located exterior to the anechoic chamber.

13. The fire suppression system of claim 1, wherein each tubing outlet is located above a predetermined area of the anechoic chamber to be protected from fire.

14. The fire suppression system of claim 1, wherein the location in which each tubing extends into the anechoic chamber through the ceiling comprises an anechoic gasket and at least two flanges.

15. The fire suppression system of claim 1, wherein each tubing comprises phenolic tubing.

16. The fire suppression system of claim 1, wherein the fire sensor may be selected from the group consisting of a smoke detector, a heat detector, a light detector, and a fire detector.

17. The fire suppression system of claim 1, wherein the fire retardant fluid may be selected from the group consisting of natural water and water mixed with fire fighting additives.

18. The fire suppression system of claim 1, wherein the fire suppression system is activated manually.

19. The fire suppression system of claim 1, wherein each outlet only opens upon exposure to heat above 150 degrees Fahrenheit to allow fire retardant fluid to be released from each tubing into the anechoic chamber.

20. A fire suppression system for an anechoic chamber comprising: a plurality of pneumatic valves attached above and exterior to a top surface of the anechoic chamber, wherein each pneumatic valve comprises at least one inlet and at least one outlet, wherein each outlet only opens upon exposure to heat above 150 degrees Fahrenheit; a plurality of non-retractable tubings, wherein a first end of each tubing is in fluid communication with one of the pneumatic valves, wherein a second end of each tubing extends into the anechoic chamber; a supply of compressed air attached to and in fluid communication with each pneumatic valve exterior to the chamber; a supply of fire retardant fluid attached to and in fluid communication with each pneumatic valve exterior to the chamber; a manually activated fire alarm operatively connected to the supply of compressed air; wherein, the supply of compressed air will maintain each pneumatic valve in a closed position preventing fluid communication between the valve inlet and the valve outlet, further wherein once the fire alarm is manually activated, a signal is transmitted to the supply of compressed air to vent the compressed air out of a venting line that is exterior to the chamber thereby opening all the pneumatic valves, allowing fire retardant fluid to pass through into each valve into each tubing; and wherein once each outlet open upon exposure to heat above 150 degrees Fahrenheit in the anechoic chamber, the fire retardant fluid is released from each tubing into the anechoic chamber.

\* \* \* \* \*